United States Patent

Bakewell

[11] 4,033,831
[45] July 5, 1977

[54] METHOD OF MAKING A BI-METAL SCREEN FOR THICK FILM FABRICATION

[75] Inventor: Joseph J. Bakewell, Boxford, Mass.

[73] Assignee: Dynamics Research Corporation, Wilmington, Mass.

[22] Filed: Sept. 23, 1974

[21] Appl. No.: 508,554

Related U.S. Application Data

[63] Continuation of Ser. No. 321,461, Jan. 5, 1973, abandoned.

[52] U.S. Cl. .............................. 204/11; 101/128.4; 204/24
[51] Int. Cl.² ...................... C25D 1/08; C25D 7/00
[58] Field of Search .......... 101/128.4; 204/129.55, 204/129.65, 11, 17, 15, 24

[56] References Cited

UNITED STATES PATENTS

| | | | |
|---|---|---|---|
| 2,071,249 | 2/1937 | Cantor | 101/128.3 |
| 2,419,026 | 4/1947 | Norris | 101/128.2 |
| 2,469,689 | 5/1949 | Gresham | 204/15 |
| 2,569,752 | 10/1951 | Fowler | 101/128.3 |
| 3,139,392 | 6/1964 | Mears | 204/15 |
| 3,325,319 | 6/1967 | Frantzen | 204/15 |
| 3,359,192 | 12/1967 | Heinrich et al. | 204/129.65 |

*Primary Examiner*—T. M. Tufariello
*Attorney, Agent, or Firm*—Weingarten, Maxham & Schurgin

[57] ABSTRACT

A bi-metal screen for the fabrication of precisely dimentioned thick film elements and a method of screen fabrication. The bi-metal screen comprises a first metal screen which provides a web or mesh with accurately placed openings for holding a spacer sheet which contains the desired thick film pattern. The mesh is electroformed onto the spacer sheet, and a cavity with accurate cross section control corresponding to the dimensions of the desired thick film element is produced in the spacer sheet from the opposite side of the mesh. The spacer is also etched through the openings in the support mesh to permit inking of the thick film cavity from the mesh screen side. Accurate alignment is maintained between the opening of the support mesh and the pattern of the desired thick film elements during fabrication.

3 Claims, 28 Drawing Figures

FIG. IA
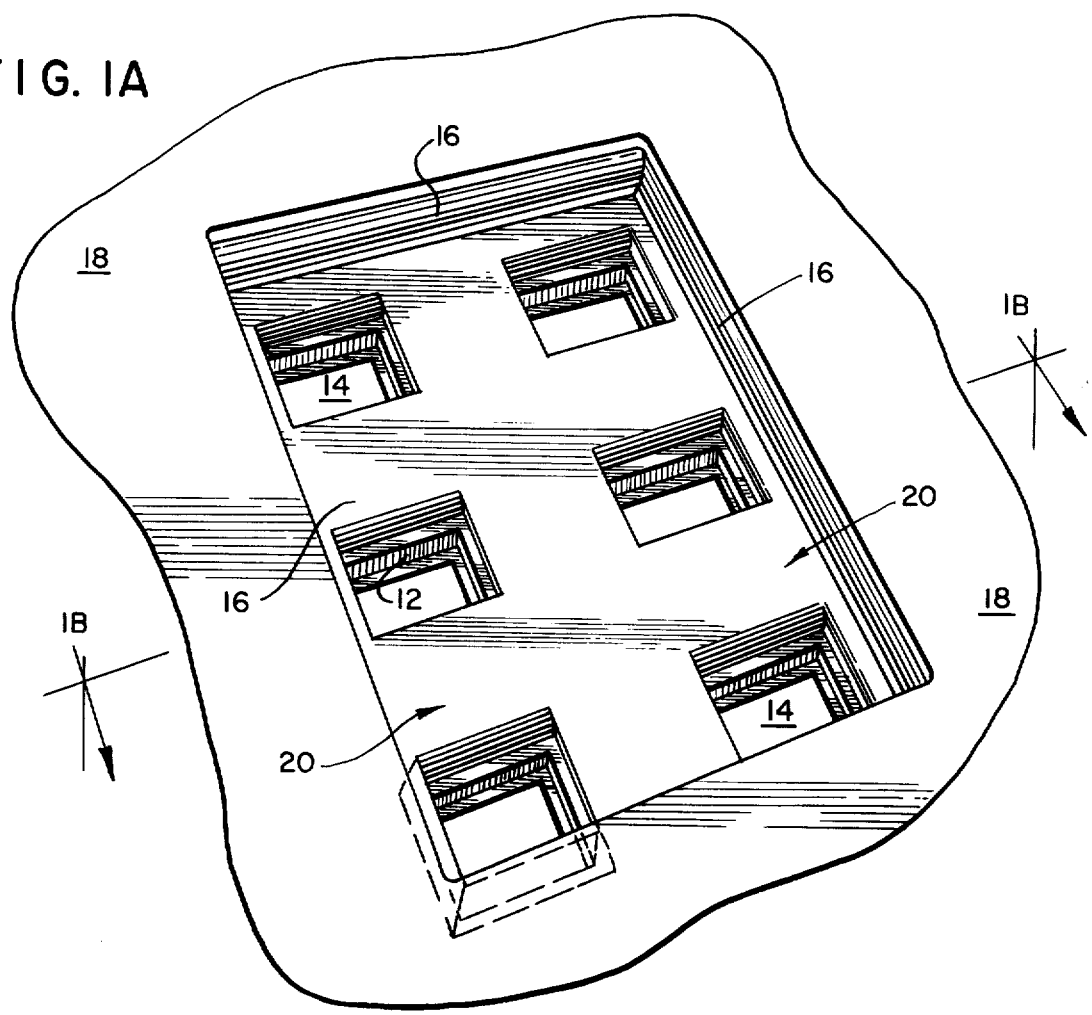
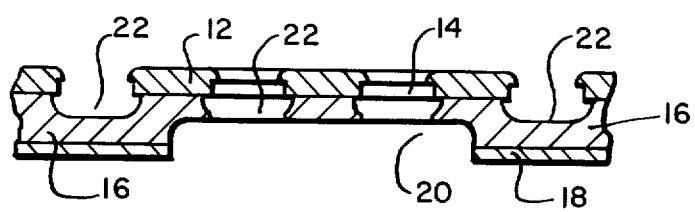
FIG. IB

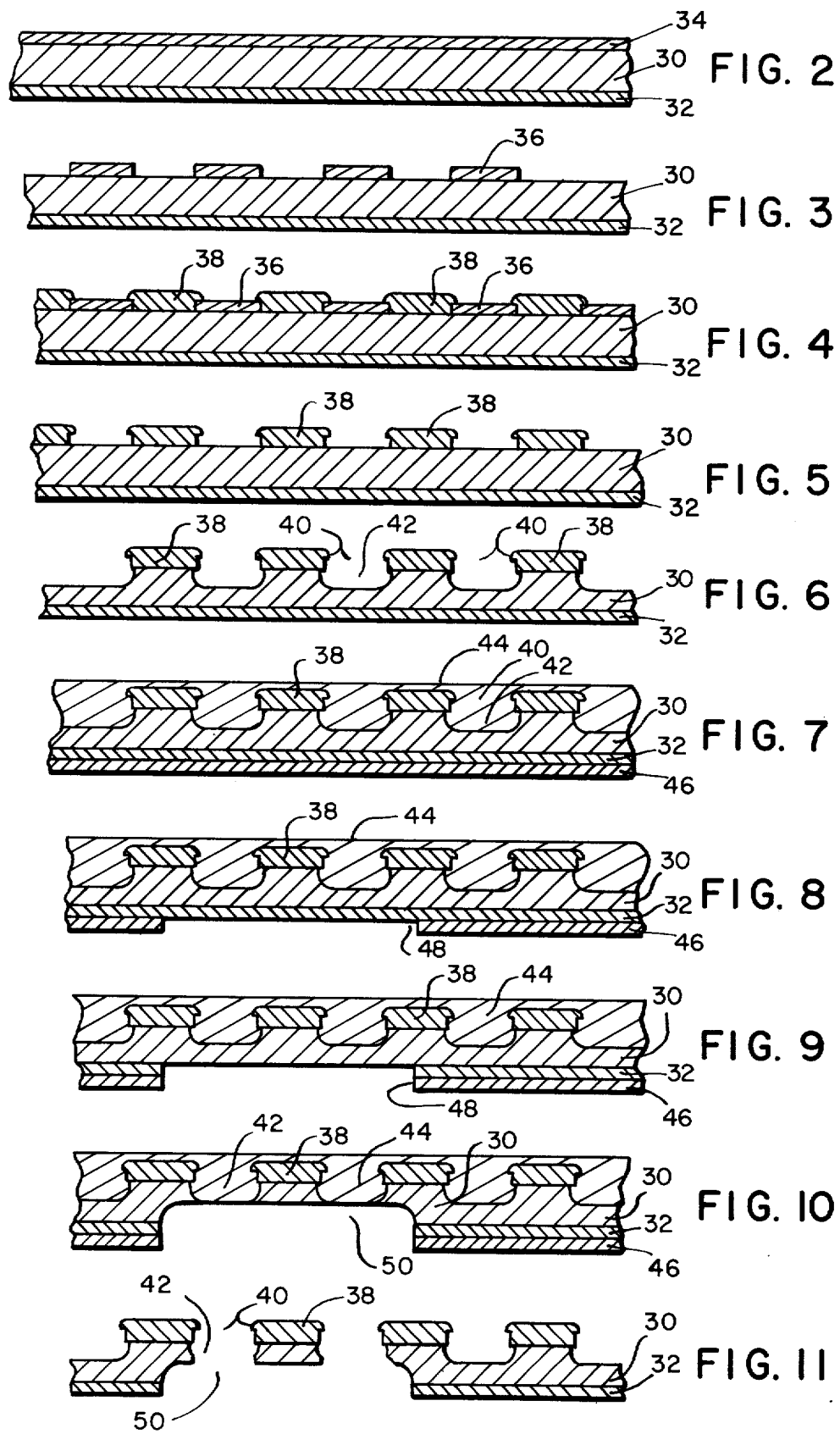

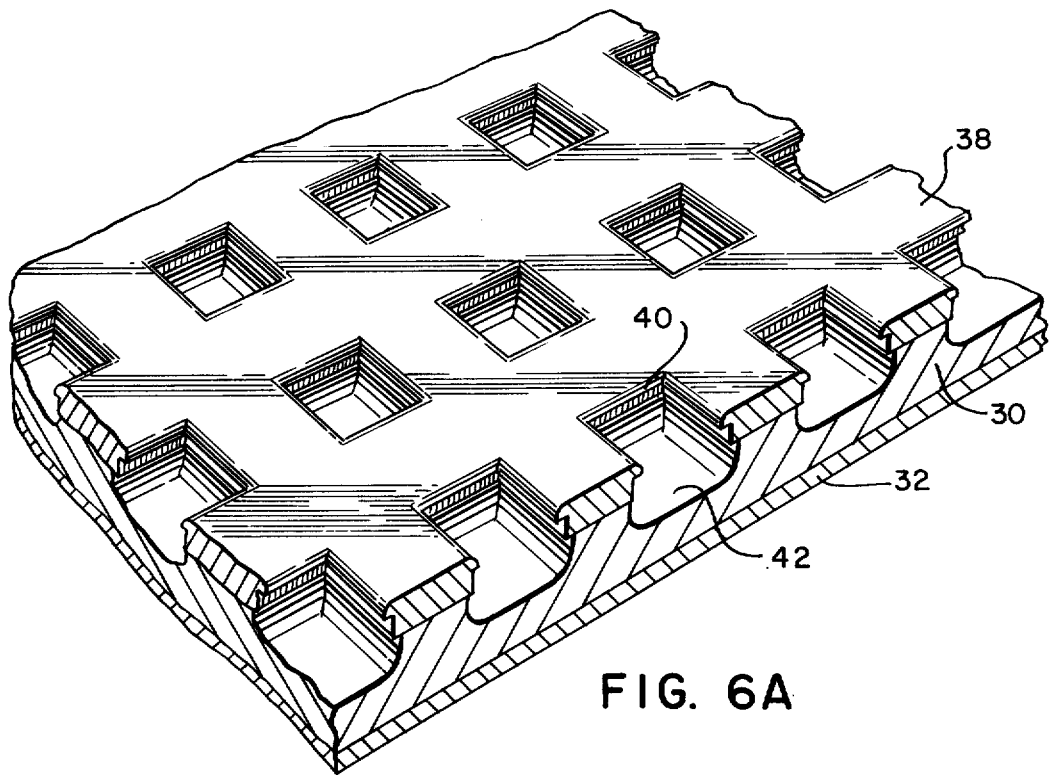
FIG. 6A
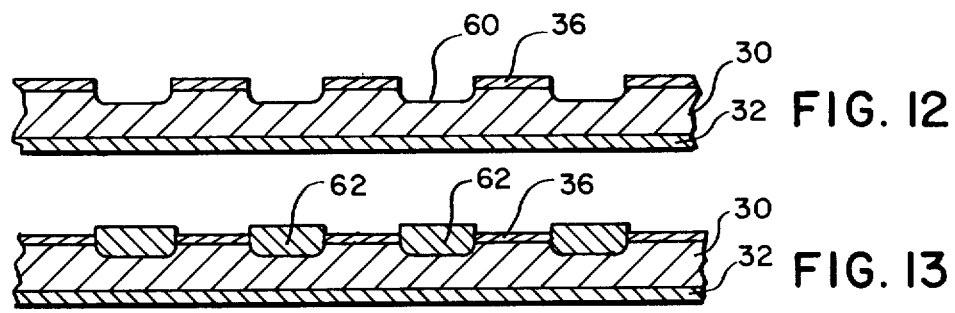
FIG. 12
FIG. 13

METHOD OF MAKING A BI-METAL SCREEN FOR THICK FILM FABRICATION

This is a continuation of application Ser. No. 321,461 filed Jan. 5, 1973, now abandoned.

FIELD OF THE INVENTION

This invention relates to screens for silk screening and in particular to screens for fabrication of precisely dimentioned thick film elements.

BACKGROUND OF THE INVENTION

In the thick film fabrication of elements such as electrical resistors on circuit boards, it is important that the finished resistor have accurately controlled dimensions so that its resistance be made to correspond to a predetermined value. In prior art thick film screens, it has been common to use a woven screen with a mesh as fine as 400 wires per inch and to either immerse the screen in a photosensitive emulsion which is photo chemically developed to provide the resistor pattern or to apply a foil to one surface of the woven screen to define the pattern for the thick film elements. In either case it has been necessary to trim the resulting thick film elements so that, in the case of resistors, accurate resistance values can be achieved.

The inaccuracies in these prior art techniques are due in part to a lack of control over the cross sections of the resulting thick film elements. Particularly in the case of the emulsion filled weave, a thick deposition is difficult to achieve and thickness control is poor. In the case of the foil technique, while cross-sectional control is improved, it is difficult to achieve islands in the thick film deposition.

SUMMARY OF THE INVENTION

According to a preferred embodiment of the present invention a screen for thick film fabrication is provided which allows accurate control of the cross-sectional area of thick film depositions and eliminates the difficulty in pattern edge control resulting from imprecise placement of traditional screen wires.

The screen of the preferred embodiment comprises a planar metal support mesh, electroformed on one surface of a metal spacer sheet, to provide a precisely controlled pattern of openings in the support mesh for inking. The support mesh and spacer sheet are typically of different metals, such as nickel and copper, to permit selective etching of one without the other. The exposed areas of the spacer sheet are subsequently etched to a predetermined depth to provide a screen which is suitable for receiving a desired thick film pattern and may be sold as such.

To achieve this pattern, the spacer sheet is etched from the side opposite to the support mesh with the design of the thick film deposition to form a cavity of a precisely controlled depth and area in predetermined alignment with openings in the support mesh so as to provide uniform edges for the ultimate thick film pattern. The prior etch through the mesh openings into the spacer sheet is to a depth such that the etch from the opposite surface of the spacer sheet completely opens passages through the spacer sheet in alignment with the mesh openings. During the screening process, the mesh and sheet are pressed up against an object and ink is worked through the surface of the support mesh and into the cavity of the spacer sheet to produce the deposition pattern on the object.

To futher refine the precision of the edges of the deposition pattern, the surface of the spacer sheet opposite from the support mesh can be originally covered with a thin metal lamination such as nickel which is first etched in correspondence with the deposition pattern to define a precise pattern edge with minimum undercutting. Subsequently the copper spacer sheet backing the thin nickel lamination is etched as indicated above to define the depth of the pattern.

Additional durability and strength can be provided to the support mesh by plating a chromium or other layer on its outer or inner surface.

DESCRIPTION OF THE DRAWINGS

These and other features of the invention are more fully described in a detailed description of the preferred embodiment presented below for purposes of illustration, and not by way of limitation, and in the accompanying drawings of which:

FIGS. 1A and 1B are bottom and sectional views respectively of a completed screen according to the invention and suitable for use in silk screen thick film fabrication;

FIGS. 2 through 11 are sectional views illustrating steps in the process of fabricating the screen of FIGS. 1A and 1B;

FIG. 6A is a top view of the screen at the stage of processing indicated in FIG. 6;

FIGS. 12 and 13 indicate in sectional view modified steps in the process of formation to provide a stronger mesh support;

DETAILED DESCRIPTION OF THE INVENTION

Figure 14:
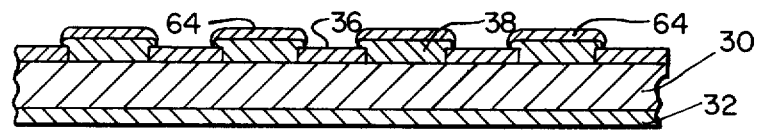
FIGS. 14 through 16 indicate in sectional view a first modified process for chrome plating the support mesh.

With reference to FIGS. 1A and 1B there is shown a completed screen for thick film fabrication which provides precise cross-sectional size control of the thick film deposition and eliminates the variations in deposition edge shape due to imprecise wire positioning in woven screens of prior art thick film techniques. In the embodiment of FIGS. 1A and 1B the support for the screen pattern is provided by a unitary nickel mesh 12 having a plurality of rectangular holes or openings 14 therethrough. The mesh 12 is in attached relationship to a copper spacing sheet 16 etched to define a cavity 20 which controls the depth and area of the thick film deposition. On the surface of the sheet 16 opposite to the nickel screen 12 is a nickel layer 18 with etchings corresponding to the etchings in the copper spacing sheet 16.

The cavity 20 is in predetermined alignment with the holes 14 to provide complete inking through the holes 14 into the entire region of the cavity 20. Additionally, the copper sheet 16 has preferably been etched through the holes 14 in the mesh 12 in regions 22 to a depth sufficient to expose the cavity 20 through holes 14 such that ink applied across the exposed surface of the mesh 12 is communicated through the holes 14 and regions 22 into the cavity 20. The depth of the cavity 20 determines the actual height of the thick film deposition when the screen is removed from the substrate or object receiving the pattern. It is to be kept in mind that the relative sizes of parts may vary greatly.

With this view of the ultimately intended screen provided in FIGS. 1A and 1B as background, a greater understanding of the advantages of the screen of the present invention can be obtained by reference to FIGS. 2–11 indicating the steps typically employed in the formation of the screen of FIGS. 1A and 1B.

With reference to FIG. 2 the processing of the ultimate screen may begin with a commercially available laminate comprising a copper layer 30 bonded to a substantially thinner nickel layer 32. As indicated in FIG. 2 the copper layer 30 has a photoresist layer 34 applied to its surface opposite from the nickel layer 32. As seen in FIG. 3, the photoresist layer 34 is subsequently exposed and developed to leave a regular pattern of rectangular regions 36 of photoresist. The rectangular regions 36 are typically arranged in a matrix of orthogonal rows and columns to provide the holes for the ultimately generated nickel mesh. As shown in FIG. 4, a mesh layer 38 is produced by electroplating an nickel layer onto the exposed surface of the copper layer 30 surrounding the photoresist regions 36. With the electroplating of the nickel mesh 38 completed, the photoresist regions 36 are removed to provide the structure indicated in FIG. 5. Subsequently, an etching agent which attacks copper but not nickel is employed to etch a predetermined distance into the copper layer 30 through the surface regions exposed by holes 40 in the nickel mesh 38 to provide etched regions 42 in FIG. 6 corresonding to regions 22 of FIGS. 1A and 1B. The structure in FIG. 6 may typically be the structure provided to the ultimte user who will produce the necessary etching to produce the structure of FIGS. 1A and 1B. FIG. 6A is a top pictorial view of the screen at the point of processing shown in FIG. 6. As shown in FIG. 7, a wax coating 44 may be applied to the surface containing the etched portions 42 and the nickel mesh 38 so as to protect that surface of the screen, and a photoresist layer 46 may be pre-applied to the exposed surface of the thin nickel layer 32.

Continuing the process beyond FIG. 7, the photoresist layer 46 is exposed and developed with the pattern of the ultimtely desired thick film deposition in controlled relation with holes 40 as indicated in FIG. 8 to provide an opening 48 corresponding to the regions to receive a thick film deposition. Subsequently as shown in FIG. 9, an etchant which attacks nickel is employed to etch the nickel layer 32 through the opening 48 using the layer 46 as a resist mask. The thinness of the nickel layer 32 insures a minimum of undercutting during etching through its thickness and thus guarantees a sharp edge of the boundaries of the thick film deposition ultimately desired. The etchant used to erode the nickel layer 32 may be selected to leave the copper in the layer 30 unaffected. A subsequent etch is employed to erode the copper layer 30 to a predetermined depth to define a cavity 50 with the height of the ultimately to be produced deposition as shown in FIG. 10. The etchant for this copper etch is typically selected so as not to erode the nickel layer 32. In this case, the nickel layer 32 acts as a resist mask for etching the copper layer 30. Also, the previous etch into the regions 42 of the copper layer 30 has been to a depth sufficient to cause the subsequent etch through the openings 48 to reach the regions 42.

Subsequently the wax 44 and the photoresist layer 46 are dissolved to leave the structure indicated in FIG. 11 corresponding to the ultimately desired bi-metal screen for thick film fabrication also indicated in FIGS. 1A and 1B.

With reference now to FIGS. 12 and 13 a modification in the processing between FIGS. 3 and 4 is indicated to provide a thicker and stronger nickel support mesh 38. The copper layer 30 in FIG. 3 is etched through the exposed surfaces surrounding the rectangular regions 37 of photoresist to a predetermined depth to result in etched portions 60. A nickel mesh 62 is then electroplated as a substantially thicker mesh in place of the mesh 38 indicated in FIG. 4. Subsequent processing follows the pattern indicated beyond FIG. 4.

Figure 15:
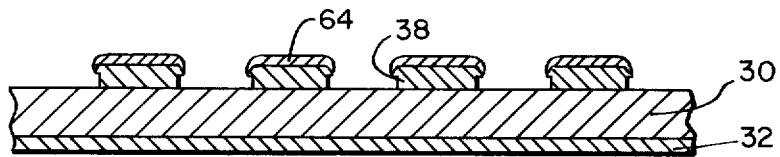
Figure 16:
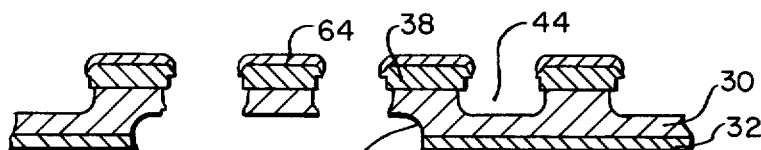
Figure 17:
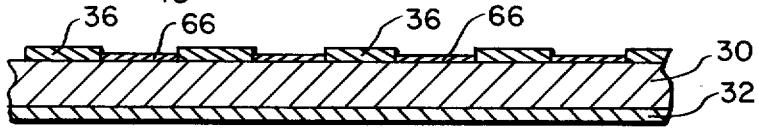
FIGS. 17 through 20 indicate in sectional view a second modified process for chrome plating the support mesh for the screen of the invention.
Figure 18:
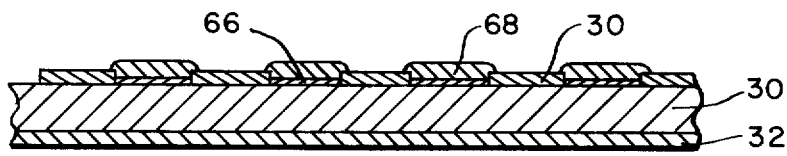

To provide greater durability to the nickel mesh 38 the process of fabrication can be modified as indicated in FIGS. 14–16, FIGS. 17–20 or FIGS. 21 and 22 to provide a chromium layer on the nickel mesh. As indicated in the first modification of FIGS. 14–16, the mesh 38 of FIG. 4 is electroplated with a shallow chromium layer 64. In FIG. 15 the photoresist portion 36 has been removed as in the step corresponding to FIG. 5, and ultimately, as indicated in FIG. 16, the desired thick film screen is produced similar to FIGS. 1A and 1B with the addition of a chromium surface 64 to the nickel mesh 38. The chromium surface 64 not only adds stiffness and durability to the nickel mesh 38 but also provides scratch and chemical resistance particularly significant when the screen is reused.

Figure 19:
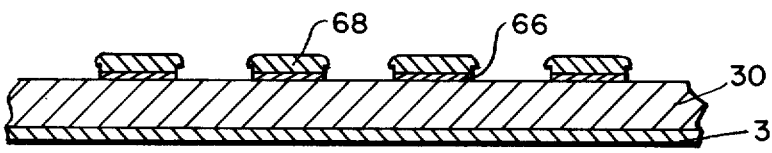
Figure 20:

With reference to the second modification indicated in FIGS. 17–20, the structure of FIG. 3 is electroplated with a shallow chromium deposition 66 on the exposed surface of the copper layer 30 surrounding the photoresist region 36. Subsequently, a nickel mesh 68 is electroplated over the chromium deposition 66 to provide the structure indicated in FIG. 18. In FIG. 19 the photoresist portions 36 have been removed to leave the nickel mesh 68 with an inner chromium layer 66 providing the stiffness and durability and chemical resistance previously indicated. FIG. 20 indicates the ultimate thick film screen corresponding to FIGS. 1A and 1B with the chromium layer 66.

Figure 21:
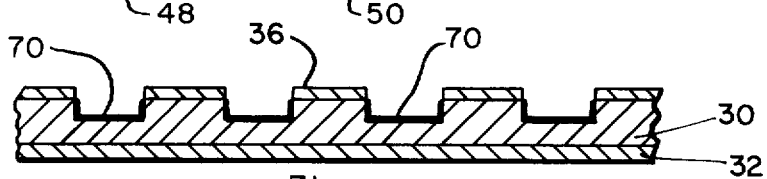
FIGS. 21 and 22 show a further modified process for chrome plating the support mesh.
Figure 22:
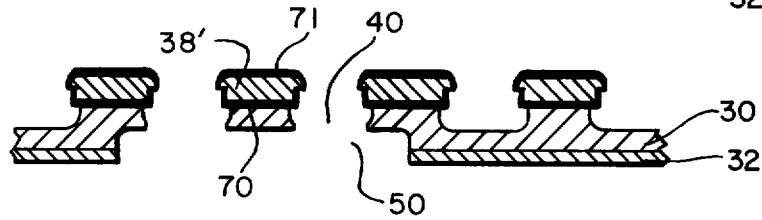

In FIGS. 21 and 22 the chromium layer is applied in a further modified form which combines the modified processing of FIGS. 12–20. To the structure of FIG. 12 a chromium layer 70 is plated as shown in FIG. 21 onto exposed portions of the copper layer 30 where the support mesh 38' is to be placed according to FIG. 13 processing. After the mesh 38' is in place, a top chromium layer 71 is applied as in FIG. 14 to provide top and bottom chromium layers as are shown in FIG. 22.

It can be seen that the structure of FIGS. 1A and 1B or FIGS. 16, 20 or 22 provides a silk screen process thick film screen which has accurate control over the height of the thick film deposition resulting from the controlled etch into the copper sheet 30 and further provides a sharp crisp edge definition from the etch of the thin nickel layer 32 and from the ability to control alignment of the edges of the etch into the nickel layer 32 with holes in the nickel mesh 38 owing to the original, precise placement of the photoresist rectangular regions 36.

While the nickel layer 32 is effective in improving the edge definition, it is to be noted that significant improvement and overall cross setional control for the thick film deposition can be achieved without the use of the nickel layer 32 by using a single etch into the copper sheet 30 to define the cross section of the deposition. It is additionally possible to use etchants for the steps of eroding the copper sheet 32 which weakly attack the nickel particularly the mesh 38 to provide a slight rounding of the edges of the mesh 38 bordering the holes therethrough. This improves the action of inking the screen particularly when using a squeege as is common in silk screen processing.

Figure 23:
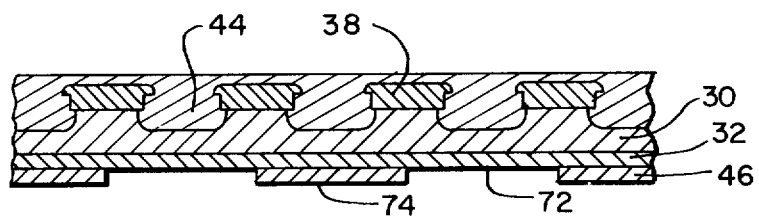
FIGS. 23 through 26 present a modified process wherein a screen may be produced according to the invention to leave islands.
Figure 24:
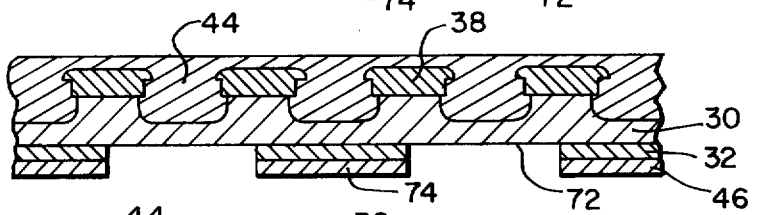
Figure 25:
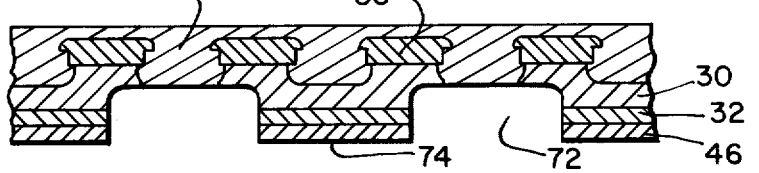
Figure 26:
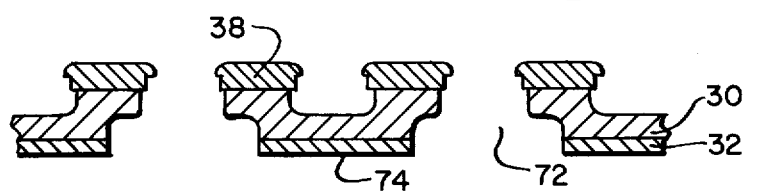

A further processing modification is shown in FIGS. 23-26 to illustrate production of islands, or pattern details unconnected to the background in a thick film pattern according to the invention. In FIG. 23, where the process is continued beyond FIG. 7 according to the modification, the photoresist layer 46 is exposed and developed to produce a hole 72 with an inner island 74. As shown in FIG. 24, the hole 72 and island 74 are reproduced in the nickel layer 32 by etching that layer with the photoresist layer as a resist mask. A subsequent copper etch shown in FIG. 25 is employed, and ultimately in FIG. 26 the final screen is produced by dissolving the photoresist layer 46 and wax 44.

Having described above a preferred embodiment for the present invention and several modifications, it will occur to those skilled in the art that other modifications and alterations to the disclosed design can be achieved without departing from the spirit of the described invention. Accordingly, it is intended to limit the scope of the invention only as indicated in the following claims.

What is claimed is:

1. A method for fabricating a bi-metallic screen for printing precisely dimensional thick film elements of printed electronic circuits comprising the steps of:
   applying a thick film element edge defining layer of a first metal to a spacing sheet formed of a second metal having a different etching characteristic from that of the edge defining layer;
   said edge defining layer having a thickness substantially less than the thickness of the spacing sheet;
   removing portions of said edge defining layer in a plurality of defined areas by etching of said edge defining layer substantially without undercutting thereof to expose areas of said spacing sheet through said edge defining layer;
   etching first cavities into said spacing sheet through the areas exposed by the removed portions of said edge defining layer;
   the first cavities being etched to a depth which is a predetermined portion of the thickness of the spacing sheet;
   producing a row and column matrix of unconnected insulator regions over the surface of said spacing sheet opposite to the surface having said edge defining layer;
   the dimensions of said insulator regions being substantially smaller than the dimensions of the removed areas of said edge defining layer;
   electrodepositing a metal on the portions of the opposite side of the spacing sheet surrounding said insulator regions to provide a support mesh;
   the metal of said support mesh having a different etching characteristic from that of said spacing sheet;
   the electrodepositing step providing a support mesh extending outwardly from said spacing sheet and contacting said spacing sheet substantially only at areas around said insulator regions;
   said first cavities being etched with respect to the matrix of said insulator regions to provide at least one edge of said cavities parallel to at least one of the rows and columns of said matrix;
   removing the insulator regions; and
   etching a matrix of second cavities into the spacing sheet through the openings of the support mesh exposed by the removal of the insulator regions, the etching of said second cavities being to a depth to communicate with said first cavities.

2. The method of claim 1 further comprising the step of:
   etching third cavities into the exposed portions of the spacing sheet surrounding said insulator regions thereby to allow a thicker and stronger support mesh to be electrodeposited upon the spacing sheet;
   the third cavity etching step being after the step of producing the row and column matrix of unconnected insulator regions and before the step of electrodepositing a metal surrounding said insulator regions.

3. A method for printing precisely dimensioned thick film elements upon a substrate, comprising the steps of:
   applying a thick film element edge defining layer of a first metal to a spacing sheet formed of a second metal having a different etching characteristic from that of the edge defining layer;
   said edge defining layer having a thickness substantially less than the thickness of the spacing sheet;
   removing portions of said edge defining layer in a plurality of defined areas by etching of said edge defining layer substantially without undercutting thereof to expose areas of said spacing sheet through said edge defining layer;
   etching first cavities into said spacing sheet through the areas exposed by the removed portions of said edge defining layer;
   the first cavities being etched to a depth which is a predetermined portion of the thickness of the spacing sheet;
   producing a row and column matrix of unconnected insulator regions over the surface of said spacing sheet opposite to the surface having said edge defining layer;
   the dimensions of said insulator regions being substantially smaller than the dimensions of the removed areas of said edge defining layer;
   electrodepositing a metal on the portions of the opposite side of the spacing sheet surrounding said insulator regions to provide a support mesh;
   the metal of said support mesh having a different etching characteristic from that of said spacing sheet;
   the electrodepositing step providing a support mesh extending outwardly from said spacing sheet and contacting said spacing sheet substantially only at areas around said insulator regions;
   said first cavities being etched with respect to the matrix of said insulator regions to provide at least one edge of said cavities parallel to at least one of the rows and columns of said matrix;
   removing the insulator regions;
   etching a matrix of second cavities into the spacing sheet through the openings of the support mesh exposed by the removal of the insulator regions, the etching of said second cavities being to a depth to communicate with said first cavity;
   pressing the side containing said first cavities against the substrate upon which the thick film elements are to be printed; and
   working an ink through the openings of the support mesh and into the first cavities to produce a deposition pattern on the substrate.

* * * * *